United States Patent [19]

Weisfield et al.

[11] Patent Number: 5,693,567
[45] Date of Patent: Dec. 2, 1997

[54] SEPARATELY ETCHING INSULATING LAYER FOR CONTACTS WITHIN ARRAY AND FOR PERIPHERAL PADS

[75] Inventors: Richard L. Weisfield, Los Altos; Nizar S. Kheraj, San Jose; Mai T. Nguyen, Palo Alto, all of Calif.

[73] Assignee: Xerox Corporation, Stamford, Conn.

[21] Appl. No.: 483,404

[22] Filed: Jun. 7, 1995

[51] Int. Cl.$^6$ .................................................. H01L 21/44
[52] U.S. Cl. ........................... 437/195; 437/181; 437/183
[58] Field of Search ........................... 437/52, 192, 195, 437/DIG. 981, 181, 183

[56] References Cited

U.S. PATENT DOCUMENTS

| | | | |
|---|---|---|---|
| 4,770,965 | 9/1988 | Fender et al. | 430/66 |
| 4,780,846 | 10/1988 | Tanabe et al. | 257/203 |
| 4,811,073 | 3/1989 | Kitamura et al. | 257/203 |
| 5,023,701 | 6/1991 | Sharpe Geisler | 257/203 |
| 5,182,620 | 1/1993 | Shimada et al. | 257/72 |
| 5,306,952 | 4/1994 | Matsuura et al. | 257/765 |
| 5,308,415 | 5/1994 | Chou | 437/981 |
| 5,319,206 | 6/1994 | Lee et al. | 250/370.09 |
| 5,320,927 | 6/1994 | Fender et al. | 430/128 |
| 5,381,014 | 1/1995 | Jeromin et al. | 250/370.09 |
| 5,389,558 | 2/1995 | Suwannai et al. | 437/52 |
| 5,466,956 | 11/1995 | Aeba | 257/203 |
| 5,516,712 | 5/1996 | Wei et al. | 437/40 |
| 5,518,805 | 5/1996 | Ho et al. | 428/213 |
| 5,557,534 | 9/1996 | Wu | 364/491 |

OTHER PUBLICATIONS

Lee, D.L., Cheung, L.K., and Jeromin, L.S., "A New Digital Detector for Projection Radiography," in Van Metter, R.L. and Beutel, J., Eds., Medical Imaging 1995: Physics of Medical Imaging, Proc. SPIE vol. 2432, 26–27 February 1995, pp. 237–249.

Kaneko, E., Liquid Crystal TV Displays: Principles and Applications of Liquid Crystal Displays, Tokyo: KTK Scientific Publishers, 1987, pp. 211–277.

Primary Examiner—Chandra Chaudhari
Assistant Examiner—Toniae M. Thomas

[57] ABSTRACT

A process of producing a product such as an x-ray sensor array performs two etching operations on an insulating layer to expose different parts of a conductive layer. One etch exposes part of the conductive layer in each unit of cell circuitry in the array without exposing the contact pads at the array's periphery. Then, a conductive layer including ITO is deposited over the insulating layer and patterned to form a conductive element for each unit, with the conductive element contacting the exposed part of the conductive layer. Afterward, a second etch exposes contact pads at the periphery of the array. As a result, the contact pads have high quality surfaces, facilitating testing and wire bonding.

12 Claims, 6 Drawing Sheets

SEPARATELY ETCHING INSULATING LAYER FOR CONTACTS WITHIN ARRAY AND FOR PERIPHERAL PADS

BACKGROUND OF THE INVENTION

The present invention relates to circuitry formed on a substrate.

Some conventional techniques form a conductive element, such as a layer of indium tin oxide (ITO), over a unit of cell circuitry in an array and over contact pads at the periphery of the array.

SUMMARY OF THE INVENTION

The invention addresses problems that arise in forming circuitry on a substrate.

In some conventional arrays formed on substrates, a layer of conductive metal is patterned to form lines extending across the array to contact pads at the array periphery and also to form one or more conductive components in each cell of the array. For example, each cell may include a thin-film transistor (TFT), and channel lead contacts for the TFT may be formed from the same layer of metal as the lines to which the TFT's channel is connected. Also, each cell may include a capacitor, and one electrode of the capacitor may be formed from the same layer of metal as the lines. An insulating passivation layer conventionally covers the array.

One proposed process etches openings in the passivation layer to expose a channel lead contact of each cell's TFT and also to expose contact pads at the periphery of the array. Then, the process deposits and patterns a layer of indium tin oxide (ITO) over the passivation layer. Because of the openings etched in the passivation layer, each cell's channel lead contact is electrically connected to an ITO element for the cell. In addition, each peripheral contact pad has a protective cover of ITO.

The proposed process described above is problematic in several ways: The ITO layer covering each contact pad is difficult to contact during electrical testing and during packaging. If the metal contact pads include aluminum, which is often desirable due to aluminum's properties, the ITO etchant can also attack the aluminum. Further, aluminum contact pads suffer electrochemical effects where they contact ITO during etching.

The invention is based on the discovery of an improved process that avoids the problems described above. The improved process etches openings through an insulating layer to expose a lower conductive layer in cells of an array without exposing the contact pads at the array's periphery; after forming an upper conductive layer including ITO in contact with the lower conductive layer, the improved process separately etches openings through the insulating layer to expose contact pads at the array's periphery.

As a result of the improved process, the peripheral contact pads are protected by the insulating layer while the upper conductive layer is formed. Even if the contact pads include aluminum and the upper conductive layer is ITO, etching of the upper conductive layer does not damage the contact pads.

Also, when the contact pads are subsequently exposed, their surfaces are not covered by the upper conductive layer and are therefore easier to contact during testing and packaging.

The improved process forms a first patterned conductive layer that includes a highly conductive metal. The first patterned conductive layer includes two or more conductive lines extending across an array region. Each line extends out of the array region and ends in a peripheral region. The first patterned conductive layer also includes a number of first conductive elements in the array region and a number of contact pads in the peripheral region. Each of the first conductive elements is along one of the conductive lines, while each of the contact pads is at the end of one of the conductive lines.

The improved process forms an insulating layer that covers the conductive lines and the first conductive elements in the array region and that covers the contact pads in the peripheral region. The process then etches the insulating layer to form, for each of a set of the first conductive elements, an opening in which a part of the first conductive element is exposed. The process forms a second patterned conductive layer that includes a number of second conductive elements. Each second conductive element contacts the exposed part of one of the set of the first conductive elements through the first conductive element's opening, forming an electrical connection.

Finally, the improved process again etches the insulating layer to form, for each of a set of the contact pads, an opening in which a part of the contact pad is exposed.

The improved process can be implemented, for example, with aluminum being the highly conductive metal in the first patterned conductive layer. The insulating layer can include a passivating material such as silicon oxynitride. The second patterned conductive layer can include indium tin oxide.

An implementation of the improved process can form the first patterned conductive layer by depositing an unpatterned conductive layer that includes the highly conductive metal. More specifically, the implementation can deposit a series of sublayers, at least one of which includes the highly conductive metal. The implementation can lithographically produce a pattern of mask material covering conductive lines, first conductive elements, and contact pads. The implementation can then etch to remove areas that are not covered.

An implementation can first etch the insulating layer by lithographically producing a pattern of mask material that covers conductive lines and contact pads, but has openings over first conductive elements. The implementation can then etch to remove areas that are not covered. If the etchant etches both the insulating layer and the mask material, the implementation can form openings with tapered edges.

An implementation can form the second patterned conductive layer by depositing an unpatterned conductive layer. The implementation can lithographically produce a pattern of mask material covering second conductive elements. The implementation can then etch to remove areas that are not covered.

Finally, an implementation can again etch the insulating layer by lithographically producing a pattern of mask material that covers the second patterned conductive layer and parts of the insulating layer that cover conductive lines but that has openings over contact pads. The implementation can then etch to remove areas that are not covered.

The improved process described above is advantageous because the insulating layer protects the peripheral contact pads during etching of the second conductive layer. Further, when the contact pads are subsequently exposed, they provide excellent contact surfaces.

Compared with the previously proposed technique that covers contact pads with an ITO layer, the improved process preserves the integrity of metal in the contact pads, making it possible to perform automated probe testing and wire bond assembly. ITO, on the other hand, tends to oxidize at the surface and cannot be wire bonded.

The following description, the drawings, and the claims further set forth these and other aspects, objects, features, and advantages of the invention.

DETAILED DESCRIPTION

A. Conceptual Framework

Figure 1:
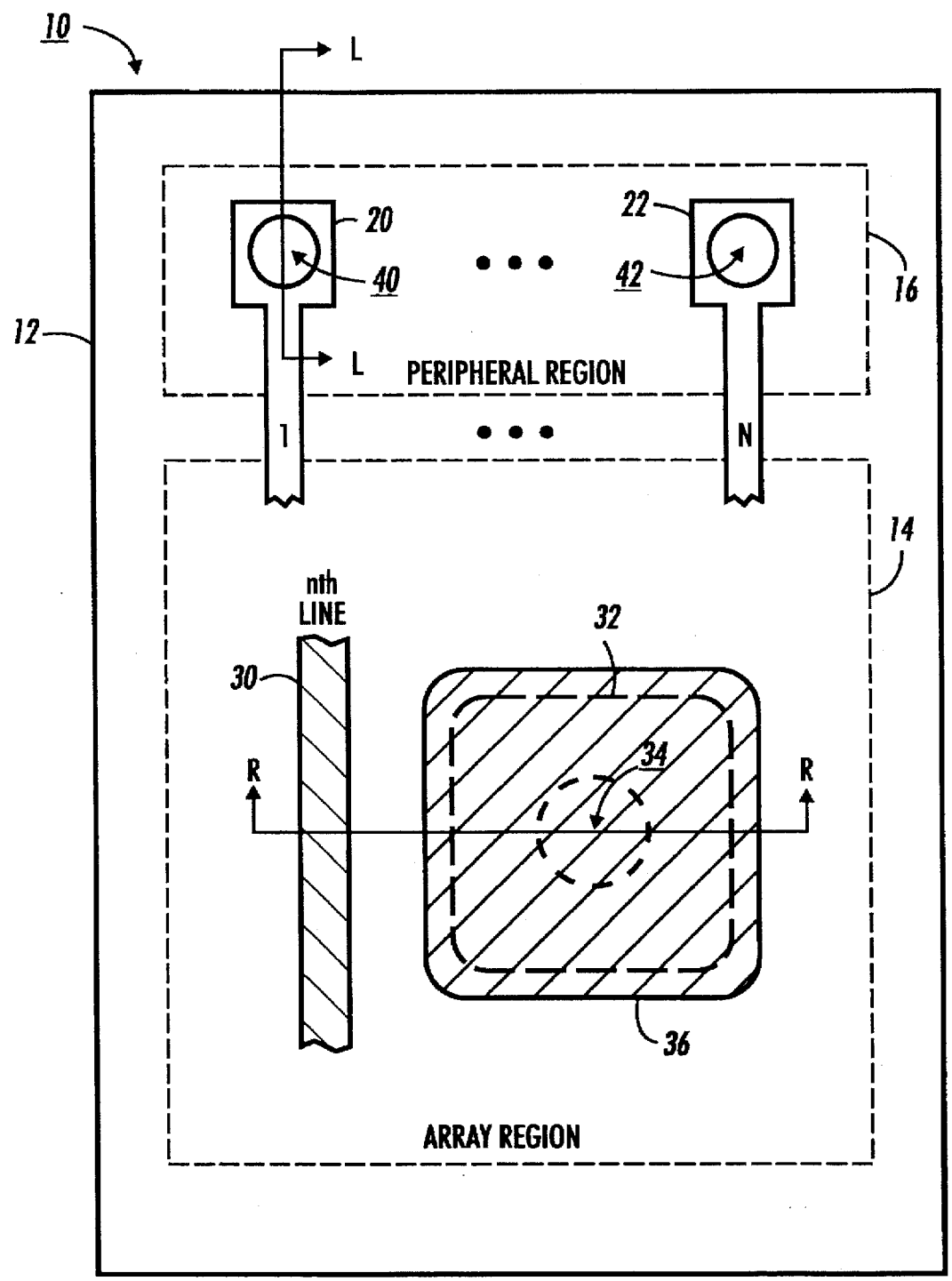
FIG. 1 is a schematic layout diagram showing a product with a patterned conductive layer that includes conductive lines and conductive elements in an array region and exposed contact pads in a peripheral region.

The following conceptual framework is helpful in understanding the broad scope of the invention, and the terms defined below have the indicated meanings throughout this application, including the claims.

"Circuitry" or a "circuit" is any physical arrangement of matter that can respond to a first signal received at one location or time by providing a second signal at another location or time, where the timing or content of the second signal provides information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

A "substrate" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

An operation "deposits" a layer by depositing material to form the layer, such as by physical or chemical vapor deposition.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

During production of an electric structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "exposed part" of a first layer that is elsewhere covered by a second layer is a part of the first layer that is not covered by the second layer. A third layer that covers the second layer may "contact" the exposed part of the first layer.

An operation "forms" a patterned layer or circuitry in a layer by a sequence of one or more operations that produce a layer that, rather than covering the entire substrate, forms a pattern. For example, the operation could deposit a layer, use lithographic techniques to form a mask, and etch away parts of the layer not covered by the mask to form a pattern.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "crossing region" is a region in which two lines cross, such as a scan line and a data line.

A "conductive layer" is a layer formed of conductive material.

An "insulating layer" is a layer formed of a non-conductive material.

A part of a layer "has an edge" if another, complementary part of the layer has been removed by one or more processes, leaving the part of the layer. The edge is the boundary between part of a layer and its complementary part. A "width" of a part of a layer such as a line is a distance between two edges.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A component in one layer is "between" edges in another layer if the projection of the component onto the surface of the substrate is between the projections of the edges.

A "connected shape" in a thin-film structure formed at a surface of a substrate is a part of the structure that is formed from a layer and is bounded by an edge that extends between a first side toward the surface and a second side away from the surface. Parts of the connected shape are "joined."

A "channel" is a part of a component through which electric current can flow. A channel is "conductive" when the channel is in a state in which current can flow through it.

A "channel lead" is a lead that connects to a channel. A channel may, for example, extend between two channel leads.

A "charge carrier" is a real or fictitious particle that can transport charge through a channel to produce a current; electrons and holes are examples of charge carriers.

A process "implants" a dopant if the process causes particles of the dopant to enter a part of an integrated circuit.

A dopant "dopes" a part of a layer if the dopant is implanted in the part. A line is "doped" if it contains an implanted dopant.

An operation "forms" an electrical connection by producing an electrical structure through which current can flow between components.

A "switching element" is a component that includes a channel that extends between two channel leads and that can be controlled to switch between high impedance and low impedance.

A "transistor" is a switching element that has a channel that extends between two channel leads, and that also has a third lead—referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

A "thin-film transistor" or "TFT" is a transistor that is part of a thin film structure.

A "capacitive element" is a component that stores a voltage level by storing charge. A capacitive element may include two conductive components, called "electrodes," separated by an insulating layer, sometimes called a "dielectric."

A conductive layer, a conductive line, or another component includes a "highly conductive metal" when the layer, line, or component includes a metal that is sufficiently conductive that signals can traverse the layer, line, or component within the switching period of related switching elements and without significant delay due to capacitance. Aluminum, certain alloys of aluminum, and certain other metals are highly conductive metals in nearly all contexts, while less conductive metals may be highly conductive at lower switching speeds.

B. General Features

Figure 2:
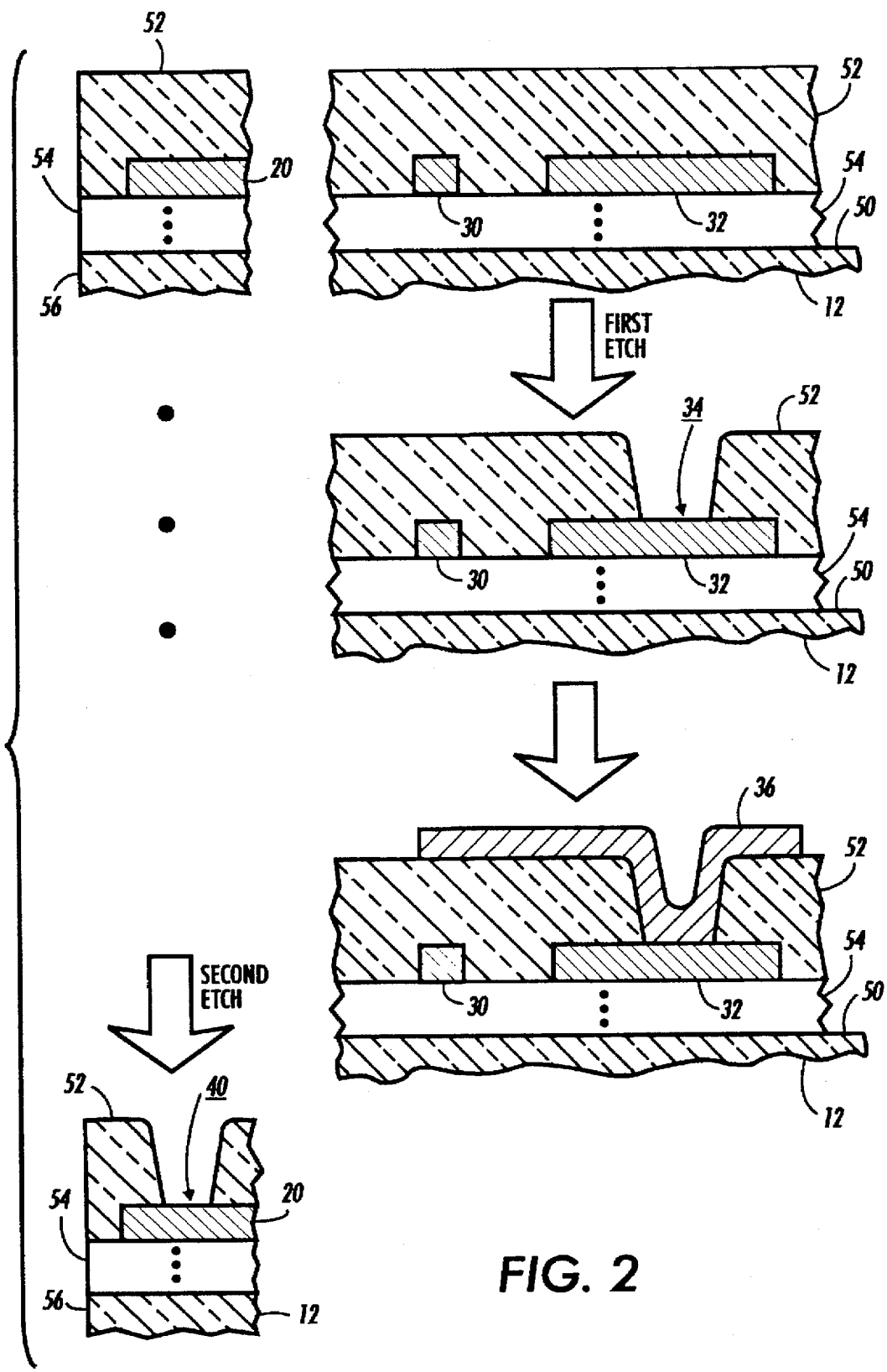
FIG. 2 is a sequence of cross sections along lines L—L and R—R in FIG. 1.

FIGS. 1 and 2 show general features of the invention. FIG. 1 shows a substrate with an array region with conductive elements along conductive lines and a peripheral region with contact pads at ends of the conductive lines. FIG. 2 shows a sequence of stages in forming the conductive elements and contact pads.

Product 10 in FIG. 1 includes substrate 12 with a surface at which circuitry can be formed. The surface includes array region 14 and peripheral region 16.

A first patterned conductive layer that includes a highly conductive metal is formed at the surface of substrate 12. The first conductive layer includes first through Nth conductive lines, each extending across the surface in array region 14 and out of array region 14 to an end in peripheral region 16. The first conductive layer also includes first through Nth contact pads 20 through 22, each at the end of one of the conductive lines.

FIG. 1 illustratively shows nth conductive line 30 in more detail. Along nth line 30, the first conductive layer includes first conductive element 32, shown with a dashed outline. Other layers (not shown) could, for example, provide a semiconductor channel or other switching element for connecting first conductive element 32 to nth conductive line 30. One or more insulating layers, not visible in FIG. 1, are formed over the first conductive layer, and an opening is then formed in the insulating layers to expose part 34, shown in a dashed outline within first conductive element 32.

A second patterned conductive layer is also formed at the surface of substrate 12, over the insulating layers. The second conductive layer includes second conductive element 36, shown with cross hatched shading. Second conductive element 36 contacts the exposed part 34 of first conductive element 32 through the opening to form an electrical connection. Contact pads 20 through 22, however, have exposed parts 40 through 42, respectively, covered neither by the insulating layers nor by the second conductive layer.

FIG. 2 shows several stages in forming features in FIG. 1 at surface 50 of substrate 12. The cross sections at left are taken through contact pad 20 along the line labeled L—L in FIG. 1, while the cross sections at right are taken through nth conductive line 30 and conductive elements 32 and 36 along the line labeled R—R.

The upper cross sections in FIG. 2 are taken after one or more insulating layers 52 have been formed over the first patterned conductive layer. As shown, one or more other layers 54 could have been formed at surface 50 before forming the first patterned conductive layer. The features in the first conductive layer shown in cross section include contact pad 20 near edge 56 of substrate 12, nth conductive line 30, and first conductive element 32.

The next cross section at right in FIG. 2 shows the result of a first etch of insulating layers 52. As shown, this etch produces an opening that exposes part 34 of first conductive element 32. Then, as shown in the following cross section at right, a second patterned conductive layer is formed, with second conductive element 36 contacting exposed part 34 of first conductive element 32 through the opening formed by the first etch.

The last cross section at left in FIG. 2 shows the result of a second etch of insulating layers 52. As shown, the second etch produces an opening that exposes part 40 of contact pad 20.

C. Implementation

The general features described above could be implemented in numerous ways to produce various products. The implementation described below produces an x-ray sensor array.

C.1. Product

Figure 3:
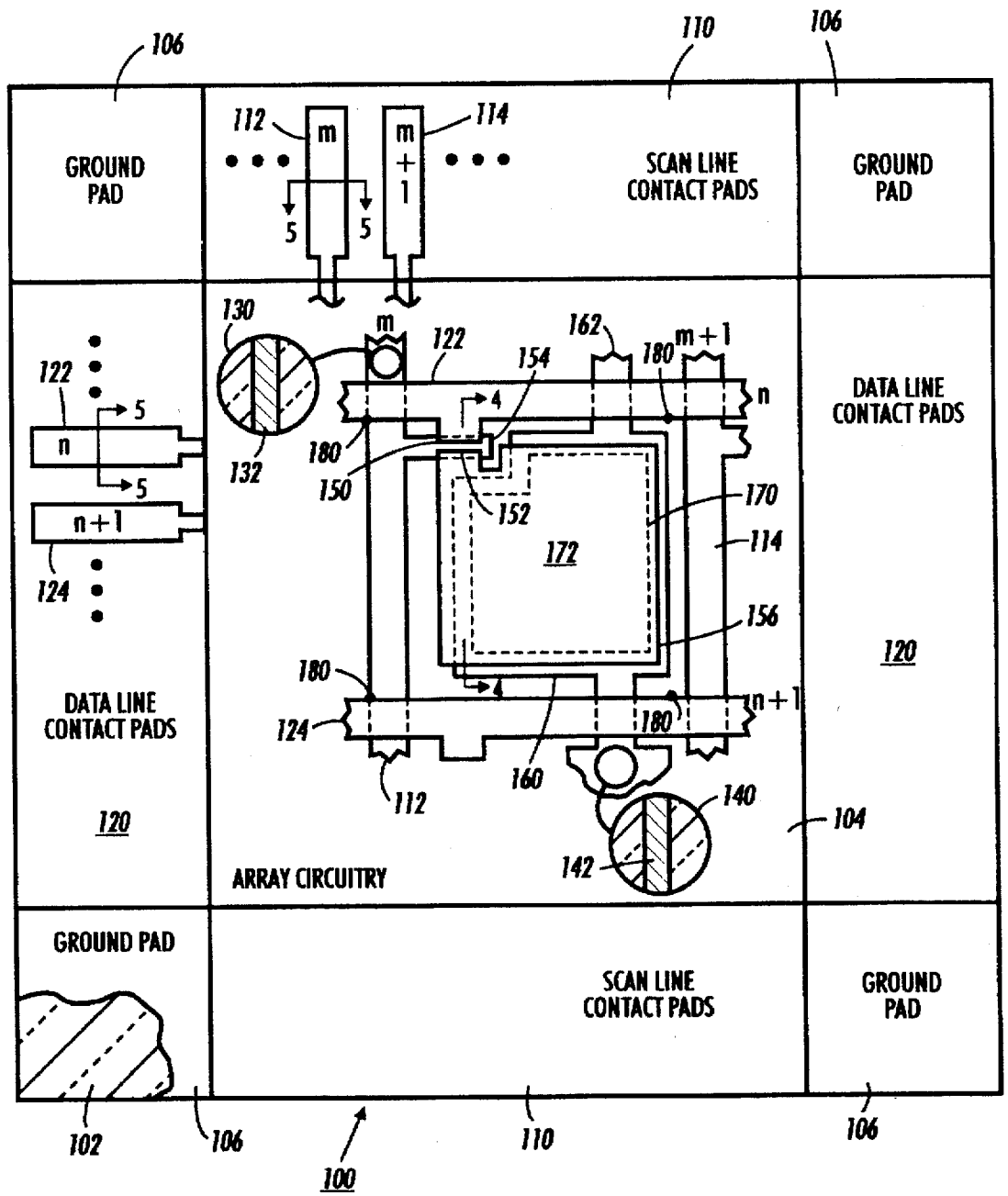
FIG. 3 is a schematic layout diagram of a product produced using a technique as in FIGS. 1 and 2.
Figure 4:
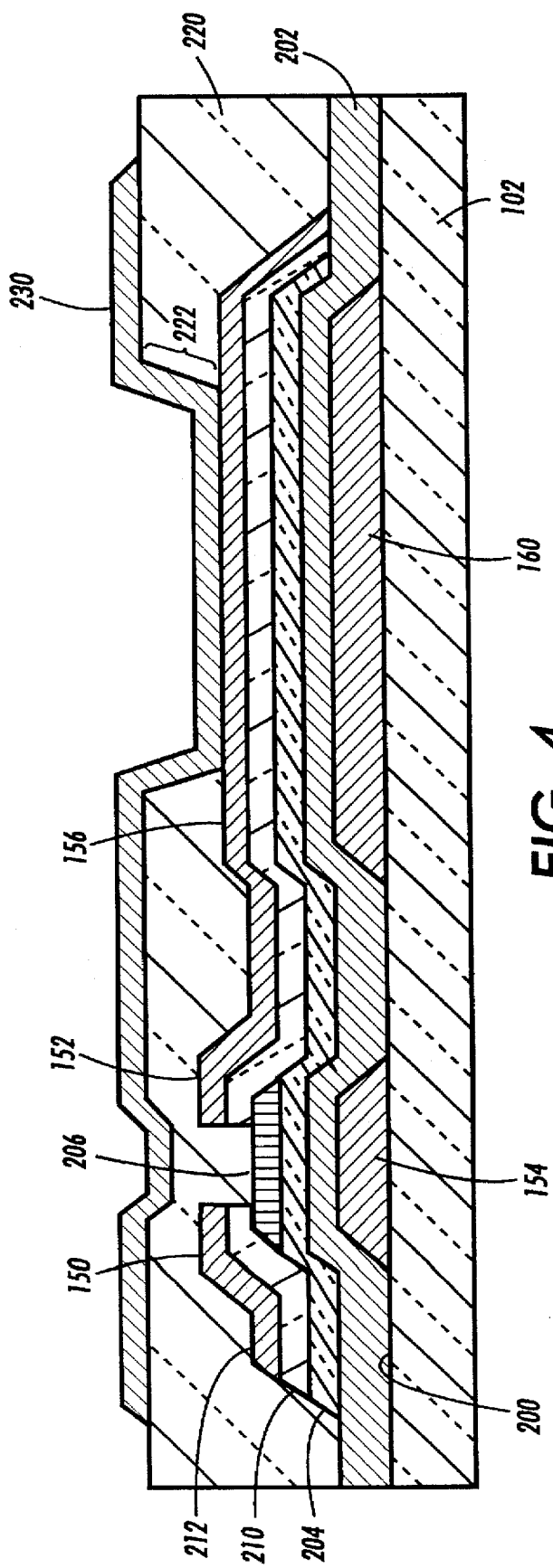
FIG. 4 is a cross-sectional view of the product of FIG. 3, taken along the line 4—4.
Figure 5:
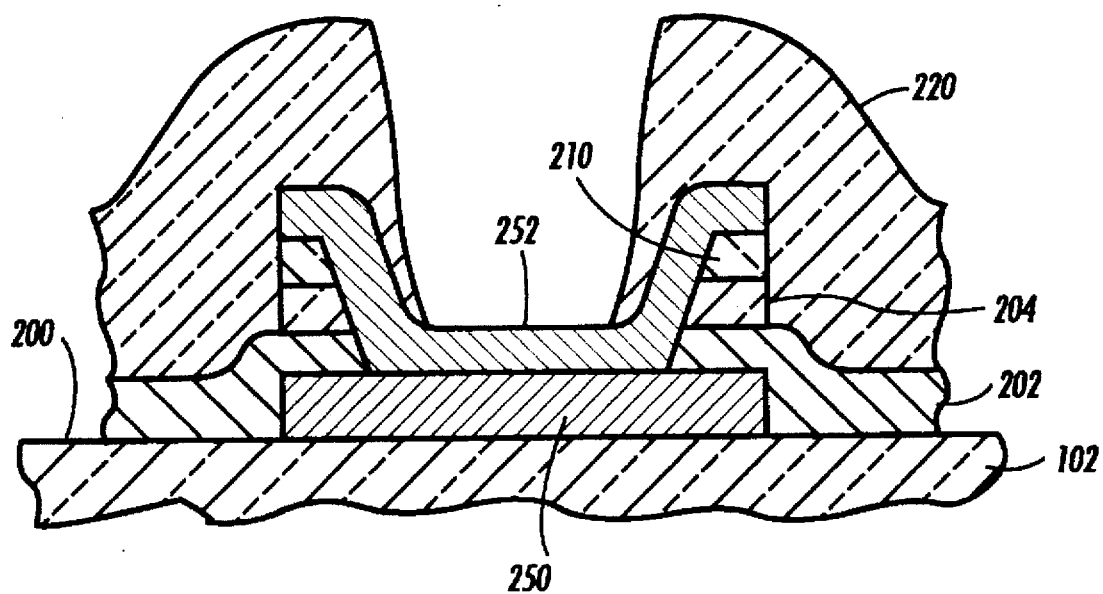
FIG. 5 is a cross-sectional view of the product of FIG. 3, taken along either of lines 5—5.

FIGS. 3-5 show features of an x-ray sensor array product produced according to the invention. FIG. 3 shows layout of circuitry on a surface of the product's substrate. FIG. 4 shows a cross section along line 4—4 in FIG. 3. FIG. 5 shows a cross section along either of lines 5—5 in FIG. 3. Further information about the product is set forth in copending, coassigned U.S. patent application Ser. No. 08/AAA,AAA (Attorney Docket No. D/95124), entitled "Array Circuitry With Conductive Lines, Contact Leads, and Storage Capacitor Electrode All Formed in Layer That Includes Highly Conductive Metal," incorporated herein by reference.

Product 100 in FIG. 3 includes substrate 102 with array circuitry 104 and with several kinds of peripheral circuitry, including ground pads 106, one at each corner of substrate 102. The peripheral circuitry also includes scan line contact pads 110 at the upper and lower sides of array circuitry 104, with FIG. 3 illustratively showing contact pads for mth scan line 112 and (m+1)th scan line 114 in more detail. The peripheral circuitry also includes data line contact pads 120 at the left and right sides of array circuitry 104, with FIG. 3 illustratively showing contact pads for nth data line 122 and (n+1)th data line 124 in more detail.

Cutaway 130 shows aluminum shunt 132 under scan line 112 providing a highly conductive path for scan signals across array circuitry 104. Cutaway 140 similarly shows aluminum shunt 142, providing a highly conductive connection for the lower electrode of the capacitor of each unit of cell circuitry to ground pads 106, which are held at a constant ground voltage during operation. Contact leads 150 and 152 are formed in the same conductive layer as data lines 122 and 124, which can similarly include aluminum to provide highly conductive connections and signal paths. As shown, contact leads 150 and 152 each overlap gate lead 154, which joins gate line 112, so that a thin film transistor is formed in semiconductor layers between contact leads 150 and 152 and gate 154.

Contact lead 150 joins data line 122, while contact lead 152 joins upper electrode 156, which covers lower electrode 160. Lower electrode 160 joins capacitive line 162, which includes aluminum shunt 142, so that lower electrode 160 is held at ground. As shown, electrodes 156 and 160 are slightly offset from each other to ensure that capacitor area, and therefore capacitance, will not decrease significantly despite slight left-right or up-down alignment errors that may occur.

Dashed line 170 shows the boundary around exposed area 172 of electrode 156. A passivating layer over electrode 156 has an opening within dashed line 170. As shown, dashed line 170 can be parallel to the boundary of electrode 156, spaced from the boundary by about 10–15 μm.

The boundary around the area of the upper conductive element is shown in FIG. 3 by dots 180, each marking a corner of the conductive element. As shown, the conductive element contacts electrode 156 in the entirety of exposed area 172 and is therefore electrically connected to contact lead 152 through electrode 156. As suggested in FIG. 3, the size of exposed area 172 can vary, but a larger area may be better because it allows a more robust contact between electrode 156 and the conductive element. Therefore, it may be desirable to make exposed area 172 as large as possible.

As shown, the conductive element of each unit of cell circuitry overlaps scan line 112, aligns with but does not overlap data lines 122 and 124, and is spaced from scan line 114. This arrangement avoids introducing noise from scan line 114 and data lines 122 and 124 while allowing maximization of the conductive element's area. The area of the conductive element can be maximized by reducing the spacing between conductive elements of adjacent units to a spacing just sufficient to maintain isolation. A spacing of approximately 10 μm has been found sufficient for this purpose.

The cross section in FIG. 4 is taken along line 4—4 in FIG. 3. FIG. 4 shows layers at surface 200 of substrate 102.

A first conductive layer, a layer of titanium tungsten in the current implementation, includes gate lead 154 and lower electrode 160. In the illustrated cross section, this conductive layer does not include an aluminum shunt layer as illustrated in cutaways 130 and 140 in FIG. 3. The aluminum shunts run only within the scan lines and the capacitor lines.

Insulating layer 202, a bottom layer of silicon nitride, covers gate lead 154 and lower electrode 160 as well as other features formed in the same conductive layer, including scan lines and capacitor lines. Over insulating layer 202 is semiconductive layer 204, a layer of intrinsic amorphous silicon (a-Si) in which the TFT channel is formed. Over semiconductive layer 204 is insulating layer 206, a top layer of silicon nitride that forms an island over the channel in layer 204 and also forms an island (not shown) over the crossover region of each scan line in which a data line crosses over the scan line.

Over layers 204 and 206 is doped semiconductive layer 210, a layer of heavily n-doped a-Si that provides conductive channel leads at each end of the channel in layer 204. As shown, layers 204 and 210 both extend over electrode 160 in the current implementation.

Over layer 210 is conductive layer 212, which includes a highly conductive metal such as aluminum. In the current implementation, layer 212 includes a lower sublayer of titanium tungsten, a middle sublayer of aluminum, and an upper sublayer of titanium tungsten. As shown, contact leads 150 and 152 and upper electrode 156 are all formed in layer 212, together with data lines as shown in FIG. 3.

Over layer 212 is insulating layer 220, a layer of silicon oxynitride that acts as a passivation layer. Layer 220 has an opening formed in it to expose an area of upper electrode 156, and edge 222 around the opening has a tapered profile as shown.

Finally, conductive element 230 is formed in a conductive layer, contacting the exposed part of upper electrode 156. Conductive element 230 is currently implemented as a layer of ITO. Conductive element 230 extends over contact leads 150 and 152 and the channel in layer 204, and can also overlap its scan line as shown in FIG. 3. Insulating layer 220 can be sufficiently thick to prevent conductive element 230 from significantly slowing propagation of signals on the scan line it overlaps. The size of the opening in insulating layer 220 can also be adjusted to provide more space for tapering to ensure that conductive element does not crack at edge 222.

FIG. 5 shows a cross section along either of lines 5—5 in FIG. 3. As suggested in FIG. 3, the cross sections of the contact pads of the scan lines and the data lines are substantially identical, so that they provide uniformly positioned surfaces for easier connection.

The first conductive layer of titanium tungsten forms lower contact pad 250. As shown, this layer does not include an aluminum shunt layer as illustrated in cutaways 130 and 140 in FIG. 3. The aluminum shunts run only within the scan lines and the capacitor lines, and do not extend under the contact pads.

Insulating layer 202 of silicon nitride, semiconductive layer 204 of a-Si, and doped semiconductive layer 210 of heavily n-doped a-Si have all been cut away by a first etch to expose most of contact pad 250. Layer 202 extends over the edges of lower contact pad 250.

Upper contact pad 252 is formed in conductive layer 212, with a lower sublayer of titanium tungsten, a middle sublayer of aluminum, and an upper sublayer of titanium tungsten as described above. The edges of lower contact pad 250 and upper contact pad 252 are approximately aligned, but alignment is not critical to formation of good contacts, as long as upper contact pad 252 covers the exposed part of lower contact pad 250. Layers 204 and 210 have been etched away except under upper contact pad 252.

Insulating layer 220 of silicon oxynitride has been cut away by a second etch to expose most of upper contact pad 252. The second etch is performed after the conductive layer of ITO has been patterned, so that the layer of ITO over insulating 220 has been removed in the area over upper contact pad 252.

C.2. Process

Figure 6:
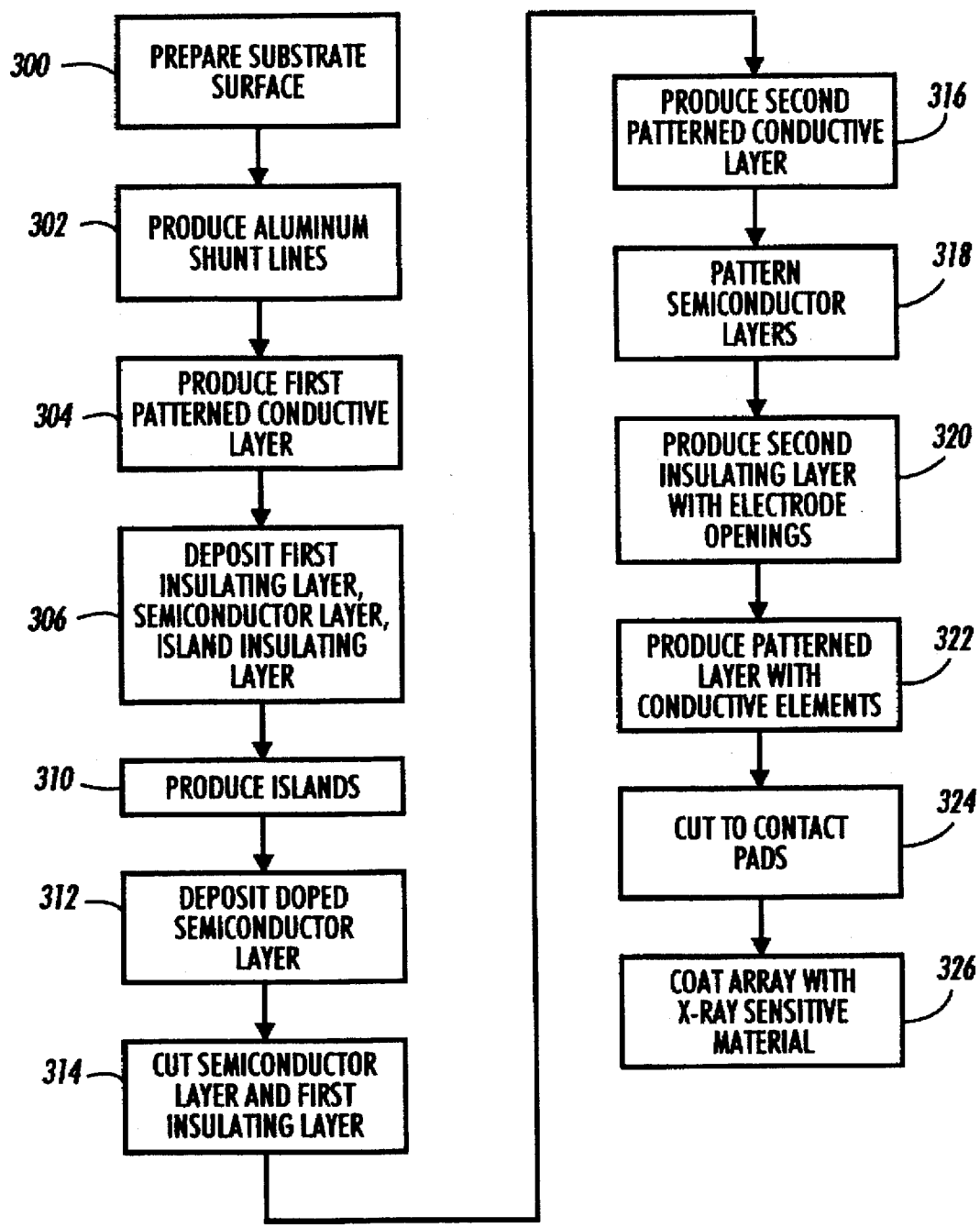
FIG. 6 is a flow chart showing a process that produces the product of FIG. 3.

FIG. 6 shows acts in producing a product as described above in relation to FIGS. 3–5. The process shown in FIG. 6 is very similar to that disclosed in copending, coassigned U.S. patent application Ser. No. 08/235,009, entitled "Electrically Isolated Pixel Element in a Low Voltage Activated Active Matrix Liquid Crystal Display and Method," incorporated herein by reference.

The act in box 300 in FIG. 6 begins by preparing a surface of a glass substrate, such as Corning 7059 glass. The act in box 300 can include any necessary cleaning.

The act in box 302 then produces the aluminum shunts illustrated in cutaways 130 and 140 in FIG. 3. The act in box 302 can sputter deposit aluminum to a thickness of about 800 Å, then use photolithographic techniques to produce a mask and etch to obtain shunt lines approximately 8 µm wide.

The act in box 304 produces the first patterned conductive layer, with scan lines, gate lead 154, lower electrode 160, and lower contact pad 250. The act in box 304 can sputter deposit an alloy of titanium tungsten to a thickness of about 1200 Å, then use photolithographic techniques to produce a mask and etch to obtain scan lines approximately 14 µm wide and other features as laid out in FIG. 3.

The act in box 304 could alternatively use other techniques. For example, the first conductive layer could include sputter deposited MoCr, or a multilayered structure of alternating layers of Al and TiW, or Al with a dual dielectric capping layer, including low temperature deposited SiON and high temperature plasma enhanced chemical vapor deposited (PECVD) SiN. These techniques are discussed in greater detail in cop ending, coassigned U.S. patent application Ser. Nos. 08/235,008, entitled "Thin-Film Structure with Conductive Molybdenum-Chromium Line; 08/234,897, entitled "Hillock-Free Multilayer Metal Lines for High Performance Thin Film Structures; and 08/234,884, entitled "Dual Dielectric Capping Layers for Hillock Suppression in Metal Layers in Thin Film Structures", all of which are incorporated by reference.

The act in box 306 then produces first insulating layer 202, conductive semiconductive layer 204, and insulating layer 206 by a sequence of PECVD steps. First insulating layer 202 can be silicon nitride deposited at about 300 degrees–380 degrees C. to a thickness of about 3000 Å. Semiconductive layer 204 can be a layer of intrinsic a-Si that includes 5–12% hydrogen and is deposited at about 230 degrees–300 degrees C. to a thickness of about 300–500 Å. Insulating layer 206 can be silicon nitride deposited primarily as an etch stop at 200 degrees–250 degrees C. to a thickness of about 1000–1500 Å.

The act in box 310 patterns insulating layer 206 to produce islands as described above in relation to FIG. 3. The act in box 310 can use photolithographic techniques to produce a self-aligned structure by first exposing a photoresist layer both from the bottom using the first conductive layer as a mask and from the top using a photolithographic mask and by then etching to remove exposed areas of photoresist and then exposed portions of insulating layer 206.

The act in box 312 deposits conductive semiconductor layer 210. The act in box 312 can deposit heavily n-doped amorphous silicon 62 with 0.5–2% phosphorous and 5–15% hydrogen at 200 degrees–250 degrees C. to a thickness of about 1000 Å. The act in box 312 could also optionally include a preliminary etch to remove some parts of layer 210.

The act in box 314 cuts through layers 202, 204, and 210. Within array circuitry 204, the act in box 312 can etch down to islands over channels in layer 206 and down to layer 202 where appropriate for isolation. The act in box 312 can, in a separate operation, etch through layers 210, 204, and 202 to expose part of lower contact pad 250. The act in box 314 can also expose appropriate parts of the capacitor lines to allow connection with ground pads 106.

The act in box 316 produces the second patterned conductive layer. The act in box 316 can sputter deposit a thin layer of titanium tungsten to a thickness of approximately 500 Å, followed by a thicker layer of aluminum to a thickness of 4000–5000 Å, and capped by a final layer of titanium tungsten to a thickness of approximately 500–1000 Å. These three metal layers can be sputter deposited in sequence in a chamber without breaking the vacuum between depositions. The act in box 316 can then use photolithographic techniques to mask and then etch the resulting layer, first etching titanium tungsten with $H_2O_2$, followed by a standard aluminum etch, and finally etching titanium tungsten again with $H_2O_2$. After etching, the second patterned conductive layer includes data lines as well as contact leads 150 and 152, electrode 156, and upper contact pad 252. In addition, the second patterned conductive layer connects the capacitor lines with ground pads 106.

The act in box 318 patterns semiconductor layers 204 and 210, leaving them only in areas that are covered by the second patterned conductive layer. Therefore, the act in box 318 can etch with the same mask as the act in box 316, but using a plasma etch of 10:1 $CF_4/O_2$. The act in box 318 thus removes layer 210 from over the channel and gate lead 154.

The act in box 320 produces second insulating layer 220 with an opening to expose part of electrode 156. The act in box 320 can deposit a passivation material such as silicon oxynitride to a thickness of 6000 Å or thicker if necessary to reduce coupling. The act in box 320 can then use photolithographic techniques to mask and then etch the resulting layer to produce an opening exposing part of electrode 156 in each unit of cell circuitry. This and other etches of layer 220 can produce an edge with a tapered profile if the etchant also attacks the photoresist mask.

The act in box 322 produces a patterned layer that forms each unit's conductive element 230. The act in box 322 can deposit ITO using reactive sputter techniques in 0.5–1.5% $O_2$ to a thickness of about 500–1000 Å. The act in box 322 can then use photolithographic techniques to mask and then etch the resulting layer to produce conductive element 230. The act in box 322 can also anneal the conductive elements at a temperature of 200 degrees–230 degrees C. for approximately one hour. As noted above, the mask used in box 322 can preserve spacings of 10 µm between adjacent conductive elements, or any spacing of 3–10 µm that is just sufficient to ensure isolation between adjacent conductive elements.

The act in box 324 cuts through to upper contact pad 252. The act in box 324 can use photolithographic techniques to mask and then etch insulating layer 220 to expose upper contact pad 252.

The act in box 326 coats array circuitry 204 with a layer of x-ray sensitive material. The act in box 326 can be implemented by evaporating an alloy of selenium and arsenic to a thickness of 100–400 µm, using conventional techniques disclosed in U.S. Pat. Nos. 5,320,927 and 4,770,965, incorporated herein by reference. Or other x-ray sensitive materials such as lead iodide or thallium bromide could be used. The x-ray sensitive material should not be applied to the peripheral circuitry that includes contact pads.

C.3. Results

The techniques described above have been successfully used to produce an 1536×1280 x-ray sensor array with a pitch for each unit of cell circuitry of approximately 100–150 µm and with a spacing of 10 µm between conductive elements of adjacent cells.

Due to the high quality surface of the contact pads, the resulting array was easy to test. In addition, wire bonds were easily formed to the contact pads.

C.4. Variations

The implementation described above provides thin film circuitry on an insulating substrate. The invention could be implemented with other types of circuitry on other types of substrates.

The implementation described above includes array circuitry with amorphous silicon TFTs, but the array circuitry could include other types of switching elements with channels formed of other materials.

The implementation described above includes a glass substrate, but other substrates could be used, such as quartz.

The implementation described above includes 1536×1280 units of cell circuitry with a pitch for each unit between 100–150 µm, but other array sizes and pitches could be used. For example, the implementation could be used with materials like selenium to produce arrays ranging from 8"×10" high resolution arrays with 50–60 µm units to 14"×18" arrays with 60–100 µm units.

The implementation described above includes layers of specified thicknesses, produced from specified materials by specified processes, but other thicknesses could be produced, and other materials and processes could be used, such as thinner semiconductor and insulating layers to improve TFT performance or to increase storage capacitance. Rather than a-Si, other semiconductor materials could be used in the semiconductor layers, including but not limited to poly-Si, SiGe, CdSe, or a composite layer of poly-Si and SiGe. Similarly, various conductive materials could be used in the scan lines and data lines, including but not limited to Al, ITO, MoTa, Cr, MoCr, Ta, Cu, Ti, TiN, and organic conductive materials. Rather than using selenium as an x-ray sensitive material, lead iodide or thallium bromide could be used.

The implementation described above provides an x-ray sensor array, but the array could sense radiation in other frequency bands. For example, an a-Si photosensitive layer could be deposited over the conductive element, along lines described in copending, coassigned U.S. patent application Ser. No. 08/CCC,CCC (Attorney Docket No. JAO-34055), entitled "Improved Solid State Sensor Array," incorporated herein by reference.

The implementation described above provides a sensor array, but the array could provide a reflective display, with the conductive elements including a very reflective metal such as aluminum, silver, or dielectric coated aluminum.

The implementation described above provides a silicon oxynitride insulating layer over a highly conductive metal layer, but other materials, such as silicon oxide or silicon nitride, could be used.

The implementation described above provides a conductive element of ITO, which is appropriate in an x-ray sensor array with a selenium coating because it provides a blocking contact that blocks injection of charge carriers into the selenium coating at high voltages. Further, ITO is transparent, which may be useful in certain applications. But other materials could be used. A refractory metal, such as chromium, titanium, tungsten, or molybdenum, or their alloys, could be used to prevent interaction between the upper capacitor electrode and a semiconductor transducer layer over the conductive elements. As noted above, a relective metal layer could be used in a reflective display. Or a heavily doped conductive semiconductor layer could be used with a semiconductor transducer layer to block charge injection into the semiconductor transducer layer.

The implementation described above includes layers in a specific sequence, but the sequence of layers could be modified, such as by adding an optional etch of the doped semiconductor layer as noted above.

The implementation described above includes units of cell circuitry laid out in a particular way, but many other layouts could be used, with components arranged differently.

D. Applications

The invention could be applied in many ways, including production of arrays for displays, sensors, and light valves.

E. Miscellaneous

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A method of forming circuitry at a surface of a substrate, the method comprising:

forming a first patterned conductive layer that includes a highly conductive metal; the first patterned conductive layer including:

two or more conductive lines; each of the conductive lines extending across the surface of the substrate in an array region; each of the conductive lines extending out of the array region to an end in a peripheral region of the surface of the substrate;

a number of first conductive elements in the array region; each of the first conductive elements being along one of the conductive lines;

a number of contact pads in the peripheral region; each of the contact pads being at an end of one of the conductive lines;

forming an insulating layer that covers the conductive lines and the first conductive elements in the array region and that covers the contact pads in the peripheral region;

etching the insulating layer to form, for each of a set of the first conductive elements, an opening in which a part of the first conductive elements is exposed without exposing the contact pads in the peripheral region;

forming a second patterned conductive layer that includes a number of second conductive elements; the second patterned conductive layer including indium tin oxide; each second conductive element contacting the exposed part of one of the set of first conductive elements through the first conductive element's opening to form an electrical connection;

etching the insulating layer to form, for each of the contact pads, an opening in which a part of the contact pad is exposed; forming the openings for each of the contact pads after forming the second patterned conductive layer.

2. The method of claim 1 in which the highly conductive metal is aluminum.

3. The method of claim 1 in which the insulating layer includes a passivating material.

4. The method of claim 3 in which the passivating material is silicon oxynitride.

5. The method of claim 1 in which the act of forming the first patterned conductive layer comprises:

depositing a first unpatterned conductive layer that includes the highly conductive metal;

performing lithography to produce a first pattern of mask material; the first pattern covering parts of the first unpatterned conductive layer that form the conductive lines, the first conductive elements, and the contact pads; and etching to remove areas of the first unpatterned conductive layer not covered by the first pattern of mask material so that the covered parts of the first unpatterned conductive layer remain.

6. The method of claim 5 in which the act of depositing the first unpatterned conductive layer comprises:

depositing a series of sublayers; at least one of the sublayers including the highly conductive metal.

7. The method of claim 6 in which the series of sublayers includes first, second, and third sublayers; the first sublayer including an alloy of titanium and tungsten; the second sublayer including aluminum; and the third sublayer including an alloy of titanium and tungsten.

8. The method of claim 1 in which the act of etching the insulating layer to form, for each of a set of the first conductive elements, an opening comprises:

performing lithography to produce a second pattern of mask material; the second pattern covering parts of the insulating layer that cover the conductive lines and the set of contact pads; the second pattern having an opening defined therein over each of the set of the first conductive elements; and etching to remove areas of the insulating layer not covered by the second pattern of mask material so that the covered parts of the insulating layer remain.

9. The method of claim 8 in which the act of etching to remove areas of the insulating layer comprises applying an etchant that etches both the insulating layer and the second pattern of mask material; the act of etching to remove areas of the insulating layer forming each first conductive element's opening with an edge that has a tapered profile.

10. The method of claim 1 in which the act of forming the second patterned conductive layer comprises:

depositing a second unpatterned conductive layer;

performing lithography to produce a third pattern of mask material; the third pattern covering parts of the second unpatterned conductive layer that form the second conductive elements; and etching to remove areas of the second unpatterned conductive layer not covered by the third pattern of mask material so that the covered parts of the second unpatterned conductive layer remain.

11. The method of claim 10 in which the act of depositing the second unpatterned conductive layer comprises:

depositing an alloy of metal oxides.

12. The method of claim 1 in which the act of etching the insulating layer to form, for each of a set of the contact pads, an opening comprises:

performing lithography to produce a fourth pattern of mask material; the fourth pattern covering the second patterned conductive layer and parts of the insulating layer that cover the conductive lines; the fourth pattern having an opening defined therein over each contact pad in the set; and etching to remove areas of the insulating layer not covered by the fourth pattern of mask material so that the second patterned conductive layer and the covered parts of the insulating layer remain.

* * * * *